United States Patent
Chao et al.

(10) Patent No.: US 6,599,842 B2
(45) Date of Patent: *Jul. 29, 2003

(54) METHOD FOR ROUNDING CORNERS AND REMOVING DAMAGED OUTER SURFACES OF A TRENCH

(75) Inventors: John Chao, San Jose, CA (US); Mohit Jain, Santa Clara, CA (US); Jeffrey D. Chinn, Foster City, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/450,475

(22) Filed: Nov. 29, 1999

(65) Prior Publication Data

US 2002/0106845 A1 Aug. 8, 2002

(51) Int. Cl.[7] .................................. H01L 21/302
(52) U.S. Cl. ................. 438/706; 438/710; 438/712
(58) Field of Search ................... 438/706, 710, 438/712, 637, 638, 713, 424, 425; 156/345

(56) References Cited

U.S. PATENT DOCUMENTS

| | | | | | |
|---|---|---|---|---|---|
| 4,729,815 A | * | 3/1988 | Leung | ................. | 156/345 |
| 4,954,852 A | * | 9/1990 | Lemnios | ................. | 357/15 |
| 5,770,465 A | * | 6/1998 | MacDonald et al. | ......... | 438/239 |
| 5,843,846 A | * | 12/1998 | Nguyen et al. | ............. | 438/713 |
| 5,902,132 A | * | 5/1999 | Mitsuhashi | ................. | 438/666 |
| 6,071,809 A | * | 6/2000 | Zhao | .......................... | 438/634 |
| 6,095,085 A | * | 8/2000 | Agarwal | .................... | 118/723 |
| 6,143,129 A | * | 11/2000 | Savas et al. | ................ | 156/345 |
| 6,187,682 B1 | * | 2/2001 | Denning et al. | ............ | 438/694 |
| 6,235,213 B1 | * | 5/2001 | Allen | .......................... | 216/67 |

* cited by examiner

Primary Examiner—Robert Kunemund
Assistant Examiner—Lan Vinh
(74) Attorney, Agent, or Firm—Townsend Townsend Crew; Joseph Bach

(57) ABSTRACT

A method for processing a substrate disposed in a substrate processing chamber to modify the contour of a trench formed on the substrate. The substrate processing chamber is the type that has a coil and a plasma generation system including a source power system operatively coupled to the coil and a bias power system operatively coupled to the substrate process chamber. The method includes transferring the substrate into the substrate process chamber. Thereafter, the substrate is exposed to a plasma formed from a first process gas consisting essentially of a sputtering agent by applying RF energy from the source power system to the coil. The plasma is biased toward the substrate by applying bias power to the substrate process chamber. Thereafter, the substrate is exposed to a plasma formed from a second process gas without applying bias power or applying minimal bias power to the substrate process chamber.

21 Claims, 6 Drawing Sheets

METHOD FOR ROUNDING CORNERS AND REMOVING DAMAGED OUTER SURFACES OF A TRENCH

BACKGROUND OF THE INVENTION

The present invention relates to a process and apparatus for etching silicon. More specifically, the present invention relates to trench etching and to forming trench structures in a silicon substrate.

Trench etching is a common procedure in the semiconductor fabrication process. The trenches are etched into a silicon substrate to form structures such as vertical transistors, isolation trenches, capacitors and others found in integrated circuits. Trenches are generally etched by forming a patterned photoresist on the surface of the substrate and then etching the exposed parts of the substrate. One or more layers of material are formed over the trench, as required, depending on the structure desired.

Referring to FIG. 1, as explained above, one use of a trench is for the formation of a vertical transistor 50. The transistor includes a trench 52, a gate oxide 54 formed over trench 52, and a polysilicon layer 56 deposited over the gate oxide and filling the trench. A drain region 58 is provided at a portion of substrate 51 adjacent to the top corners of the trench. A source region 60 is provided at a portion of substrate 51 adjacent to the bottom of corners of the trench. A channel 62 is formed between the source and drain regions to electrically couple the two regions when a voltage is applied to polysilicon 56.

Trench 52 may be formed using either wet etch techniques or dry etch techniques. Currently, dry etch techniques, particularly anisotropic methods, are generally used to form a trench with a high aspect ratio. The aspect ratio refers to a ratio of trench height to trench width. An anisotropic etch technique generally involves accelerating ions toward the substrate to etch the exposed portions of the substrate. The ions are accelerated vertically so the etching is done mostly in a vertical direction. The trench formed using such a method tends to have sharp top and bottom corners 64 and 66. The electrical field intensity at the corners increases proportionally with the sharpness of the corners. Therefore, sharp corners 64 and 66 lower the breakdown voltage of transistor 50, i.e., the maximum voltage that can be safely handled by a transistor without oxide breakdown.

In addition, ion bombardment from the anisotropic etching process may damage the outer silicon surface of the trench (e.g., outer 50–100 angstrom). For example, ion bombardment may leave the surfaces of the trench walls with numerous tiny craters, i.e., uneven surfaces. The bombardment also dislodges silicon atoms from the crystal structure and damages the crystal structure, which alters the electrical properties of the silicon substrate.

Therefore, semiconductor manufacturers generally desire to round the corners of a trench and repair the damaged outer surfaces before filling the trench and completing the formation of an integrated circuit. This process conventionally involves using at least two different etching chambers, for example, a capacitance-type etcher, and a microwave downstream etcher. The capacitance-type etcher ignites a plasma within its process chamber and uses ion bombardment to round the top corners. Then the substrate is transferred to a microwave downstream etcher. The microwave downstream etcher ignites a plasma remote from the process chamber. Radicals from the remote plasma are flowed into the process chamber to isotropically etch the trench. This isotropic etch simultaneously rounds the bottom corners and removes the damaged outer surfaces from the trench sidewalls. The top corners are further rounded during this isotropic etching.

While the conventional method works well for some processes, improvements to the process are desirable. First, the conventional process requires the use of two or more different etch chambers to modify the contour of a trench. Also, since the process simultaneously rounds the bottom corners and removes the damaged outer surfaces, these steps cannot be independently controlled. Accordingly, there is a need for an etch method which allows the contour of a trench to be modified in a single chamber and which performs the top corner rounding, bottom corner rounding, and damaged outer surface removal steps separately.

SUMMARY OF THE INVENTION

The present invention provides an improved method for modifying the contour of a trench formed on a substrate. The method rounds the top corners of the trench and performs additional trench contouring in a single chamber. The additional trench contouring includes either or both rounding the bottom corners of the trench and removing damaged outer surfaces of the trench. The method of the present invention performs each of the trench contour modification steps independently in a sequential, in-situ process that allows the contour of a trench to be tailored to a particular process. The present invention is particularly useful for the formation of high-aspect-ratio trenches in a semiconductor fabrication process.

In one embodiment of the present invention, a substrate disposed in a substrate processing chamber is etched to modify the contour of a trench formed on the substrate. The substrate processing chamber is the type that has a coil and a plasma generation system including a source power system operatively coupled to the coil and a bias power system operatively coupled to the substrate process chamber. The substrate is transferred into the substrate process chamber. The substrate is then exposed to a plasma formed from a first process gas consisting essentially of a sputtering agent by applying RF energy from the source power system to the coil. The plasma is biased toward the substrate by applying bias power to the substrate process chamber. Thereafter, the substrate is exposed to a plasma formed from a second process gas without applying bias power or applying minimal bias power to the substrate process chamber.

In another embodiment of the present invention, a substrate disposed in a substrate processing chamber is etched to modify the contour of a trench formed on the substrate. The substrate processing chamber includes a bias power system operatively coupled to the substrate process chamber. The substrate is transferred into the substrate process chamber. A first plasma is ignited from a first process gas consisting essentially of a sputtering agent. The substrate is exposed to ions and electrons dissociated in the first plasma, and the plasma is biased toward the substrate by applying bias power to the substrate process chamber. Thereafter, a second plasma is ignited from a second process gas having a halogen source, and the substrate is exposed to ions and radicals dissociated in the second plasma without applying bias power or applying minimal biasing power to the substrate process chamber. The first and second plasmas can be formed remote from the substrate processing chamber or can be formed within the chamber.

Yet in another embodiment of the present invention, a substrate is etched to form a trench thereon. A photoresist layer is patterned on the substrate to define a location for the trench. The substrate is etched to form the trench. The photoresist layer is stripped from the substrate. The substrate is transferred into a substrate processing chamber having a plasma generation system with separate controls that can independently adjust source power and bias power. The substrate is processed by flowing a first gas consisting essentially of a sputtering agent into the chamber to form a first plasma from the first gas and etching the substrate with the first plasma by applying both source power and bias power. Thereafter, a second gas including a halogen source is flowed into the substrate process chamber to form a second plasma from the second gas. The substrate is etched with the second plasma by lowering or grounding the bias power being applied to the chamber.

These and other embodiments of the present invention, as well as its advantages and features, are described in more detail in conjunction with the text below and attached figures.

For a further understanding of the present invention, reference should be made to the ensuing detailed description.

DESCRIPTION OF THE SPECIFIC EMBODIMENTS

I. Exemplary Chamber

Figure 1:
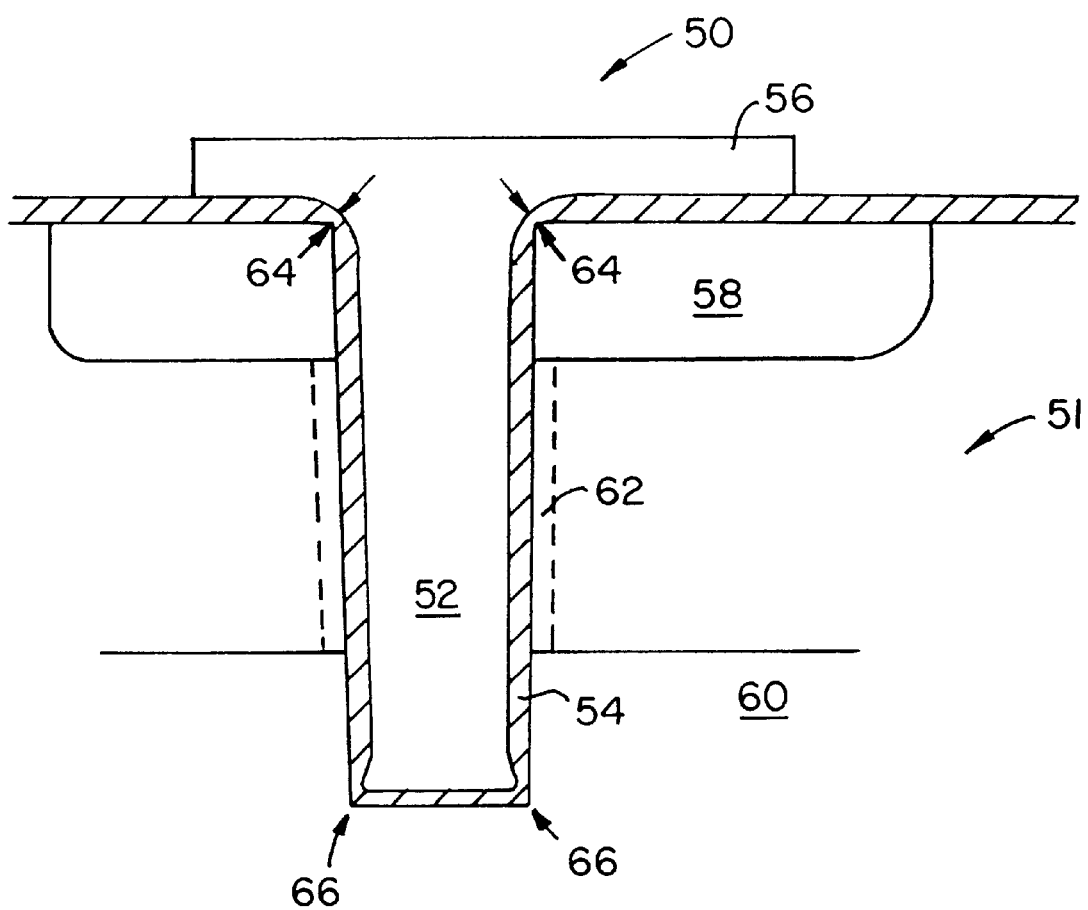
FIG. 1 is a schematic cross-sectional view of a vertical transistor.
Figure 2A:
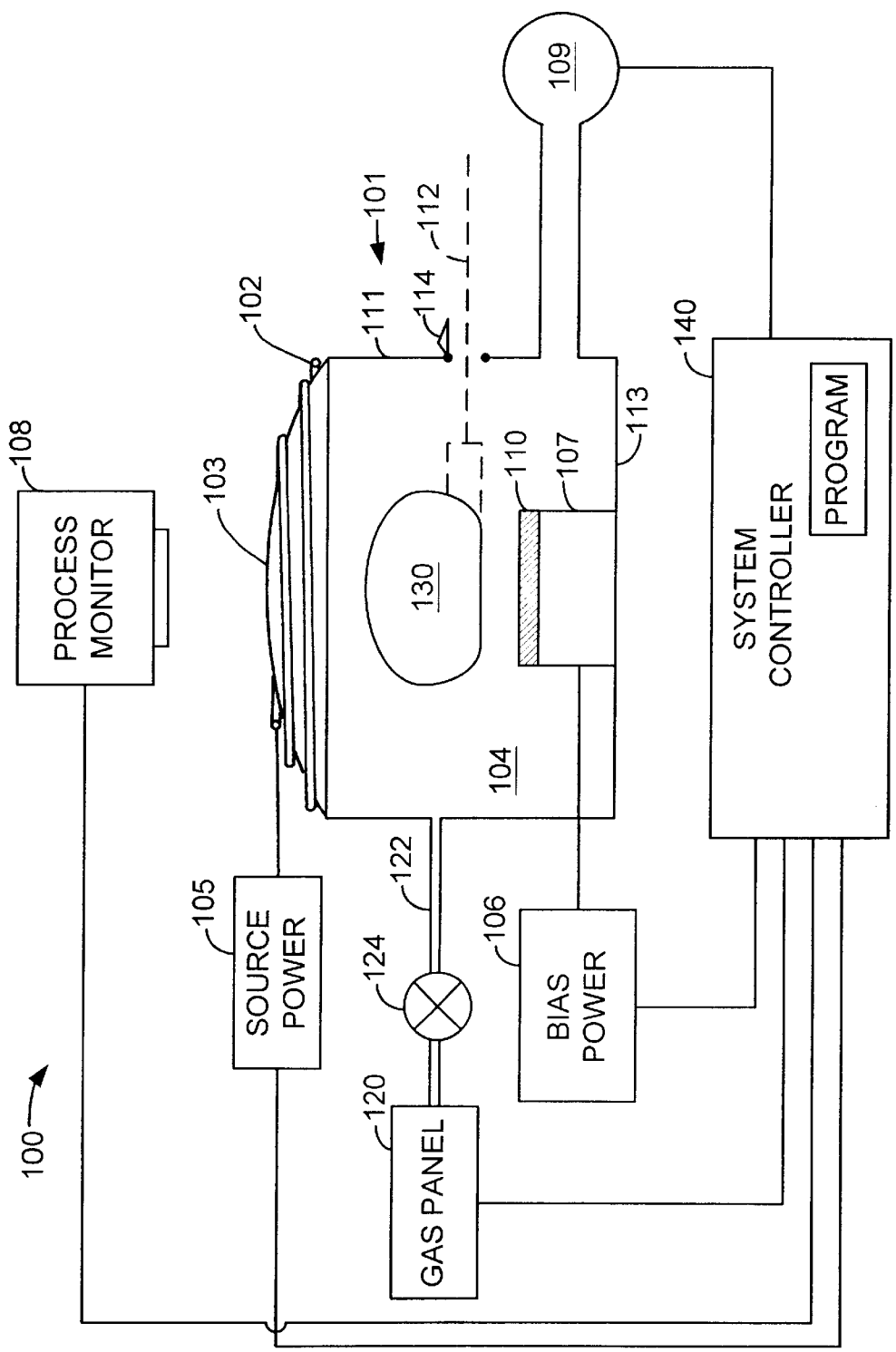
FIG. 2A shows a partial cross-sectional schematic of an exemplary semiconductor wafer processing system in which the method of the present invention may be implemented.

FIG. 2A depicts a schematic diagram of a semiconductor wafer processing system 100 in which the method of the present invention can be practiced. System 100 comprises a process chamber 101, a source power supply 105, a bias power supply 106 and a controller 140. Process chamber 101 includes an outer enclosure or housing defined by a dome 103, a cylindrical sidewall 111, and a bottom 113. Dome 103 is typically made of a dielectric material such as quartz. Sidewall 111 and bottom 113 are typically made of a metal such as aluminum or stainless steel. Source power supply 105 couples an RF signal (e.g., 12.56 MHz) to an antenna 102. Antenna 102 has a plurality of turns located proximate the top 103 and produces RF electromagnetic fields that excite a process gas (or gases) located in volume 104 to form and/or sustain a plasma 130.

A robot arm 112, shown in phantom, transfers the wafers 110 in and out of process chamber 101 through a slit valve 114. During substrate processing, a semiconductor wafer 110, which may contain partially formed integrated circuit structures, is supported upon a pedestal (electrostatic chuck) 107. Wafer 110 is exposed to the plasma to facilitate processing. Pedestal 107 and thus the wafer is biased by an RF signal (e.g., 400 KHz or 13.56 MHz) supplied to pedestal 107 by bias power supply 106. The density of ions in plasma 130 is primarily controlled by the signal applied to antenna 102, while the energy of the ions is primarily controlled by the signal applied to pedestal 107.

Temperature within chamber 101 is partly controlled by circulating a fluid (e.g., water-based ethylene glycol) through separate heat exchange passages (not shown) within sidewall 111 and dome 103 of the chamber. Temperature of the substrate being etched is controlled by a combination of a gas applied to the backside of the substrate through passages (not shown) within pedestal 107 and by circulating a fluid through a heat exchange passage (not shown) within the pedestal.

A process monitor 108 monitors conditions within process chamber 101. The process monitor can be any sensor, or combination of sensors, for measuring a condition that is dependent on the process occurring within chamber 101. By way of example, process monitor 108 is an Optical Emission Spectrometer (OES). The OES monitors emission of radiation from plasma 130. Such radiation is dependent on the progress of the process occurring in process chamber 101. Alternatively, process monitor 108 could include an interferometer for measuring elevations such as the depth of trenches etched into a surface of the wafer 110. Such an interferometer measures the depth of the trenches by interference of light reflected from the top and bottom of the trenches. If process monitor 108 is an OES or interferometer, radiation from within chamber 101 is coupled to the process monitor through a transparent aperture such as quartz top 103. Alternatively a separate window can be provided in top 103 or sidewall 111 for this purpose.

Process monitor 108 and various components of system 100 are coupled to controller 140. Controller 140 includes hardware to provide the necessary signals to initiate, monitor, regulate, and terminate the processes occurring in process chamber 101. Process chamber 101 is, for example, a decoupled plasma source (DPS) etch chamber manufactured by Applied Materials of Santa Clara, Calif. Chamber 101 contains the elements necessary to process a semiconductor wafer.

The exterior of chamber 101 is typically at ambient atmospheric pressure and the interior of chamber 101 is held at a reduced pressure during processing. An exhaust system 109 regulates the pressure within chamber 101. A gas panel 120 delivers process gases to chamber 101 via a gas line 122 and a valve 124. In a process, such as an etch process, plasma 130 is formed in the chamber 101 by applying RF power to the process gas. RF power source 105 energizes antenna 102 to ignite and sustain the plasma within chamber 101. Those skilled in the art will realize that multiple steps are necessary to excite a plasma in a process chamber, i.e., supply a process gas, apply source power to the antenna, apply bias power to the pedestal and so on. These steps are within the skill of an ordinary practitioner in the art to perform without further explanation.

Figure 2B:
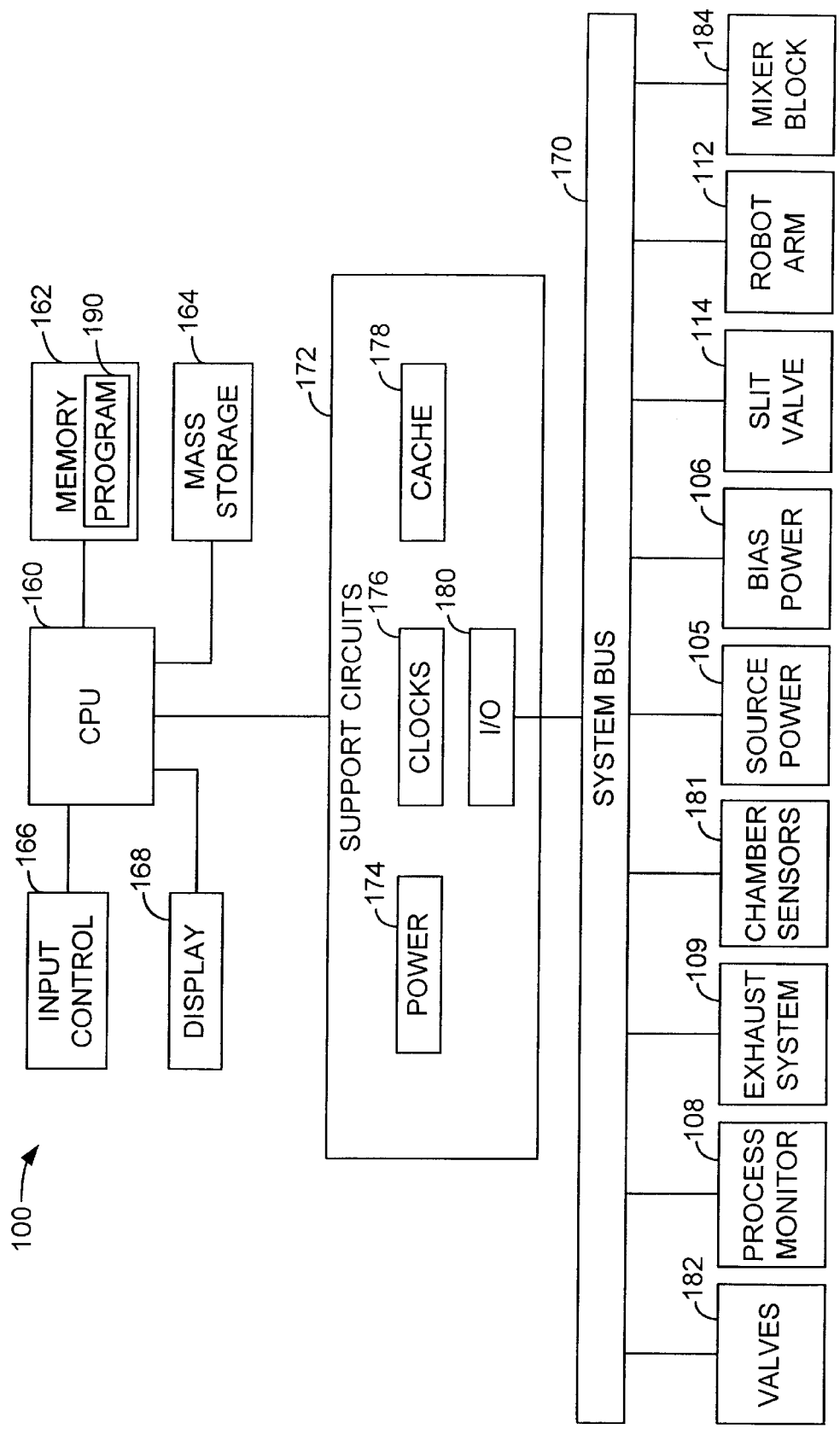
FIG. 2B shows a block diagram of the semiconductor wafer processing system of FIG. 2A.

The method of the present invention can be implemented in a system that is controlled by a processor-based system controller such as controller 140 of FIG. 2A. FIG. 2B shows a block diagram of a processing system 100, such as that depicted in FIG. 2A, having such a system controller 140 that can be employed in such a capacity. System controller unit 140 includes a programmable central processing unit (CPU) 160 that is operable with a computer-readable memory 162, a mass storage device 164, an input control unit 166, and a display unit 168. The system controller further includes well-known support circuits 172 such as power supplies 174, clocks 176, cache 178, input/output (I/O) circuits 180 and the like. Controller 140 also includes hardware for monitoring wafer processing through sensors 181 in chamber 101. Such sensors measure system parameters such as wafer temperature, chamber atmosphere pressure and the like. All of the above elements are coupled to a control system bus 170.

Memory 162 contains instructions that CPU 160 executes to control the operation of processing system 158. The instructions in memory 162 are in the form of program code such as a program 190 that implements the method of the present invention. The program code may conform to any one of a number of different programming languages. For example, the program code can be written in C, C++, BASIC, Pascal, or a number of other languages. Computer program 190 may include a number of different subroutines. For example, in one specific embodiment, program 190 includes a process selection subroutine, a process sequencer subroutine and chamber manager subroutines for each chamber in a multichamber system. Program 190 also includes subroutines to control individual components of each chamber 101, including, for example, a substrate positioning subroutine, a process gas control subroutine, a pressure control subroutine, a temperature control subroutine, and a plasma control subroutine among others. Those having ordinary skill in the art will readily recognize that other chamber control subroutines can be included depending on what processes are to be performed in process chamber 101.

The process selection subroutine identifies (i) the desired process chamber (if chamber 101 is part of a multichamber processing system) and (ii) the desired set of process parameters needed to operate the process chamber for performing the desired process. The process parameters for performing a specific process relate to process conditions such as, process gas composition and flow rates, temperature, pressure, plasma conditions such as RF power levels and the low frequency RF frequency, cooling gas pressure, and chamber wall temperature. These parameters are provided to the user in the form of a recipe and can be entered using input control interface 166.

The process sequencer subroutine includes program code for accepting the identified process chamber and set of process parameters from the process selector subroutine and for controlling operation of the various process chambers in a multichamber system. Multiple users can enter process set numbers and process chamber numbers, or a user can enter multiple process set numbers and process chamber numbers, so the sequencer subroutine operates to schedule the selected processes in the desired sequence. Preferably, the sequencer subroutine includes program code to (i) monitor the operation of the process chambers to determine if the chambers are being used, (ii) determine what processes are being carried out in the chambers being used, and (iii) execute the desired process based on availability of a process chamber and type of process to be carried out. Conventional methods of monitoring the process chambers can be used, such as polling. When scheduling which process is to be executed, the sequencer subroutine can take into consideration the present condition of the process chamber being used in comparison with the desired process conditions for a selected process, or the "age" of each particular user-entered request, or any other relevant factor a system programmer desires to include for determining scheduling priorities.

Once the sequencer subroutine determines which process chamber and process set combination is going to be executed next, the sequencer subroutine initiates execution of the process set by passing the particular process set parameters to a particular chamber manager subroutine that controls multiple processing tasks in the particular process chamber according to the process set determined by the sequencer subroutine. In operation, the chamber manager subroutine selectively schedules or calls the process component subroutines in accordance with the particular process set being executed. Typically, the chamber manager subroutine monitors the various chamber components, determines which components need to be operated based on the process parameters for the process set to be executed, and initiates execution of individual chamber component subroutines responsive to the monitoring and determining steps.

A person of ordinary skill in the art would understand how to implement each of the particular chamber component subroutines. For example, the substrate positioning subroutine would include program code for controlling chamber components that are used to load the substrate onto pedestal 107 and, optionally, to lift the pedestal and substrate to a desired height in chamber 101 for substrate processing.

Mass storage device 164 stores data and instructions and retrieves data and program code instructions from a processor readable storage medium, such as a magnetic disk or magnetic tape. For example, the mass storage device 164 can be a hard disk drive, floppy disk drive, tape drive, or optical disk drive. Mass storage device 164 stores and retrieves the instructions in response to directions that it receives from the CPU 160. Data and program code instructions that are stored and retrieved by mass storage device 164 are employed by processor unit 160 for operating the processing system 100. The data and program code instructions are first retrieved by the mass storage device 164 from a medium and then transferred to memory 162 for use by CPU 160.

Input control unit 166 couples a data input device, such as a keyboard, mouse, or light pen, to processor unit 160 to provide for the receipt of a chamber operator's inputs. Display unit 168 provides information to a chamber operator in the form of graphical displays and alphanumeric characters under control of CPU 160.

Control system bus 170 provides for the transfer of data and control signals between all of the devices that are coupled to the control system bus 170. Although the control system bus is displayed as a single bus that directly connects the devices in CPU 160, control system bus 170 can also be a collection of busses. For example, display unit 168, input control unit 166 and mass storage device 164 can be coupled to an input-output peripheral bus, while CPU 160 and memory 162 are coupled to a local processor bus. The local processor bus and input-output peripheral bus are coupled together to form control system bus 170.

System controller 140 is coupled to the elements of the processing system 100, employed in etch processes in accordance with the present invention via system bus 170 and I/O circuits 180. These elements include a plurality of valves 182 (such as valve 124 of FIG. 2A), process monitor 108, exhaust system 109, source power supply 105, bias power supply 106, slit valve 114, gas panel 120, robot arm 112, chamber sensors 181 and an optional mixer block 184 (not shown in FIG. 2A, but may be connected to either the gas panel 120 or chamber 101).

System controller 140 provides signals to the various chamber elements that cause these elements to perform desired operations in order to implement a desired process in chamber 101.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, in software, hardware, or both. Those skilled in the art will also realize that it would be a matter of routine skill to select an appropriate computer system to control substrate processing system 100.

II. Etching According to the Present Invention

The method of the present invention can be used to round the top and bottom corners and remove the damaged outer surfaces of a trench in appropriate substrate processing chambers such as the exemplary chamber described above. Where applicable, reference numbers in the description below are used to refer to appropriate components of the exemplary chamber shown in FIGS. 2A and 2B.

Figure 3:
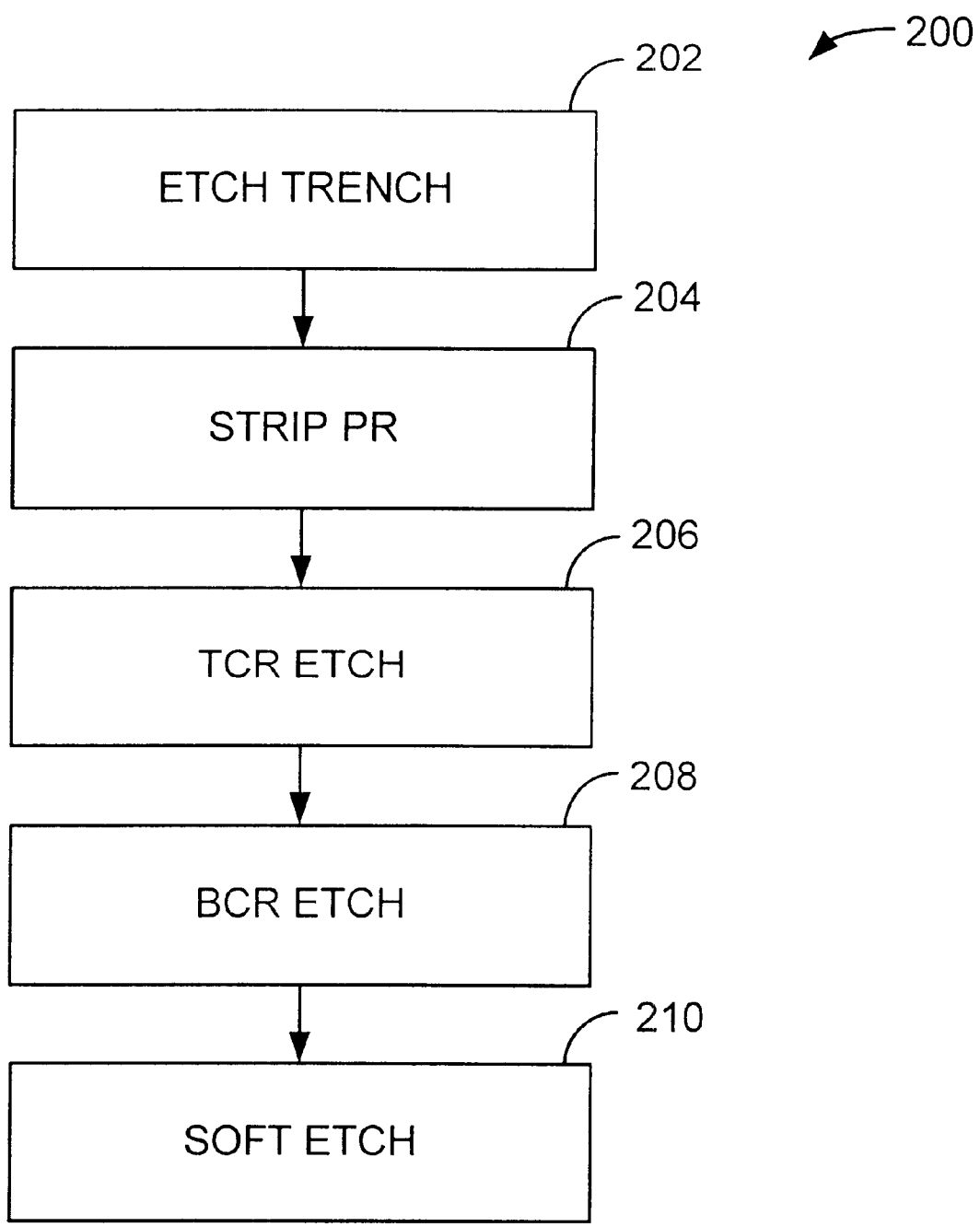
FIG. 3 is a flowchart illustrating the steps of a preferred embodiment of the present invention.
Figure 4A:
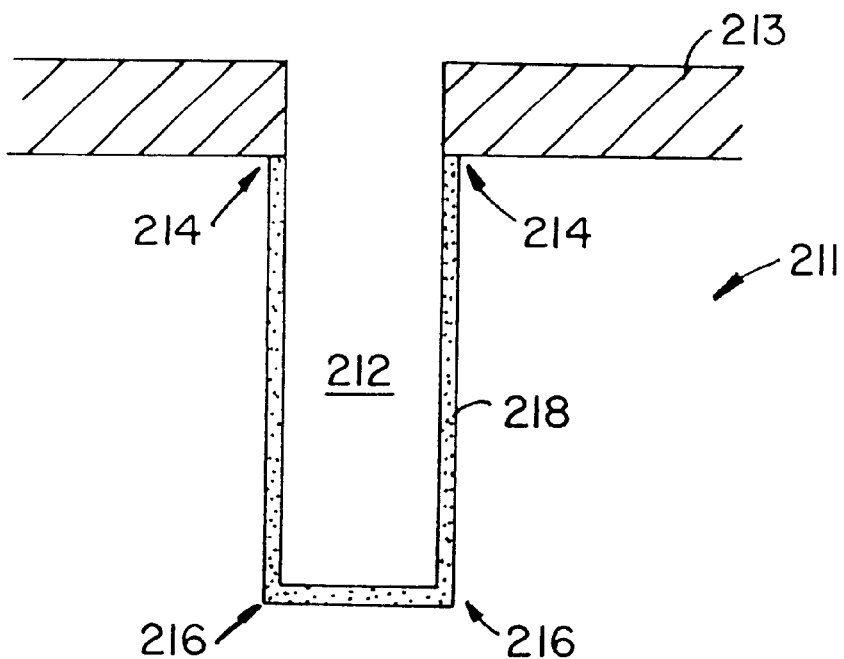
FIG. 4A is a schematic cross-sectional view of a trench etched on a substrate.

Referring to FIGS. 3 and 4A, a process 200 includes placing a substrate 211 having a patterned photoresist layer 213 deposited thereon on pedestal 107 of process chamber 101. A trench is etched on the exposed part of the substrate (step 202) using a well known anisotropic etch technique appropriate for the aspect ratio of the trench. The etching can be done in the same or different chamber than the one used to perform steps 206–210 described below. After step 202, the substrate includes a trench 212 with top corners 214, bottom corners 216, and damaged outer surfaces 218 (see FIG. 4A).

Figure 4B:
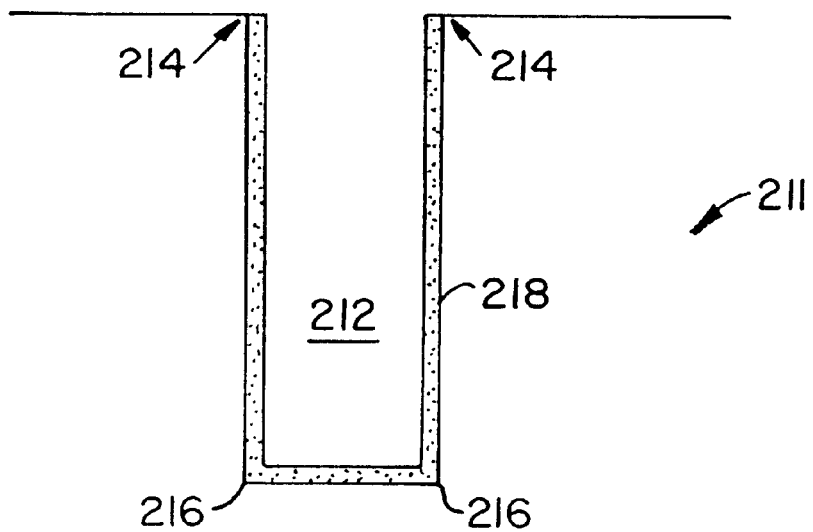
FIG. 4B is a schematic cross-sectional view of the trench of FIG. 4A with the photoresist stripped.

Referring to FIGS. 3 and 4B, the substrate is taken out of process chamber 101 and photoresist layer 213 is stripped from the substrate (step 204) using a well known stripping technique. At this point of process 200, trench 212 has relatively sharp top and bottom corners 214 and 216 since an anisotropic etch process was used to etch the trench in step 202. Sharp corners are generally undesirable because it is difficult to deposit a layer having a uniform step coverage over such corners. When trench 212 is used for the formation of a vertical transistor, sharp corners 214 and 216 are also undesirable because they lower the break down voltage of the transistor. In addition, the anisotropic etch leaves the trench with damaged outer surfaces 218, i.e., the outer surfaces are made rough and may have a damaged crystal structure. The corners are rounded and the damaged outer surfaces are removed by subjecting the trench to three independent remedial etching steps described below.

After photoresist layer 213 has been stripped in step 204, the trench is ready to be processed according to the method of the present invention. First, referring to FIGS. 3 and 4C, top corners 214 of the trench are rounded using a top-corner-rounding (TCR) etch process (step 206). The TCR process rounds the top corners primarily by a physical process, i.e., ion bombardment, and includes exposing the substrate to a plasma formed from a sputtering agent. The plasma is biased towards the substrate to increase the amount of sputtering occurring at top corners 214. Preferably, the plasma is biased using at least 50 Watts (0.28 Watt/cm$^2$), and more preferably between about 100 Watts (0.56 Watt/cm$^2$) and 500 Watts (2.78 Watts/cm$^2$). Generally, increasing the bias power increases the amount of rounding occurring at top corners 214. The duration of TCR process may be set by performing the process for a predetermined time, or using an end-point detection system or other form of in-situ monitoring system. The sputtering agent can be one or more of various inert gases such as neon, argon, krypton, xenon and radon, but preferably consists essentially of heavy inert gases since the ions generated for etching would need to possess a sufficient momentum to dislodge atoms from the substrate.

Figure 4C:
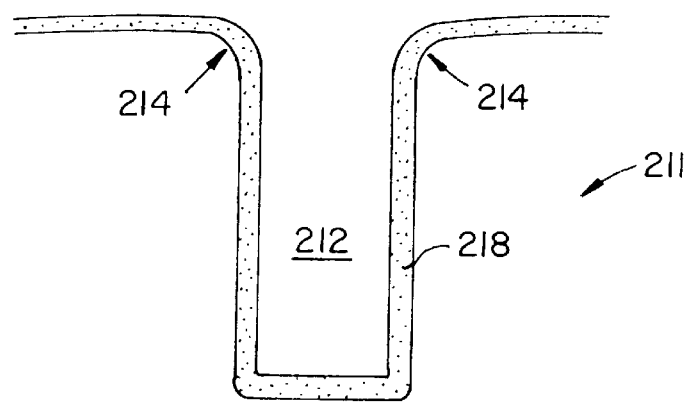
FIG. 4C is a schematic cross-sectional view of the trench of FIG. 4B after a top corner rounding has been performed.

In one implementation, the TCR is performed for 40 seconds. The chamber pressure is held at low pressure, e.g., at 6 mT. Lowering the chamber pressure produces more uniform etch results but at the cost of reducing the etch rate. A process gas including only argon is flowed into the chamber at 100 sccm. Source power supply 105 applies 1000 Watts of RF powers at a frequency of 12.56 MHz to antenna 102 to ignite a plasma from the process gas. Bias power supply 106 applies about 200 Watts (1.11 Watt/cm$^2$) of RF power at a frequency of 400 KHz or 13.56 MHz to pedestal 107 to accelerate the ions toward the substrate. As shown in FIG. 4C, TCR process 206 primarily alters the contour of top corners 214. Bottom corners 216 are rounded and damaged outer surfaces 218 are removed in subsequent steps.

Figure 4D:
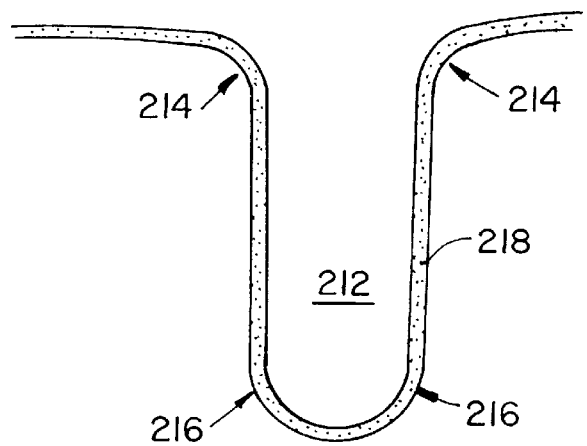
FIG. 4D is a schematic cross-sectional view of the trench of FIG. 4C after a bottom corner rounding has been performed.

Next, referring to FIGS. 3 and 4D, bottom corners 216 of the trench are rounded using a bottom-corner-rounding (BCR) etch process (step 208). The BCR process rounds the bottom corners using primarily a chemical process. The process includes exposing the substrate to a plasma formed from a process gas having one or more halogen sources. Preferably, the process gas also includes a source (e.g., oxygen) which enhances the dissociation of halogen sources, or a dilutant (e.g., argon), or both.

The BCR etch process uses high ion flux (preferably at least $1 \times 10^{11}$ ions/cm$^3$) and low ion energy. Bias power is turned off or applied at minimal power (i.e., no more than 50 Watts or 0.28 Watt/cm$^2$) to eliminate or at least minimize further physical etching. A preferred gas mixture for the process gas is $SF_6$, $CF_4$, and $O_2$, or $SF_6$ and Ar. The presence of $SF_6$ in the process gas enhances rounding of the bottom corners. However, if the etch process is performed too long, outer surfaces of the trench get rough because $SF_6$ is a harsh chemical agent. The ideal duration of BCR process varies from one application to another and is determined experimentally for each application. Generally, the ideal duration is inversely proportional to the flow rate of $SF_6$. The duration of BCR process may be set by performing the process for a predetermined time, or using an end-point detection or other forms of in-situ monitoring system. Generally, increasing the source power, increasing the chamber pressure, increasing the flow rate of $SF_6$ or $CF_4$, all increase the amount of rounding occurring at the bottom corners.

In one implementation, the BCR process is performed for 40 seconds. The chamber pressure is held at low pressure, e.g., at 5 mT. Lowering the chamber pressure produces more uniform etch results but at the cost of lowering the etch rate. A process gas is flowed into the chamber at the flow rate of 5 sccm of $SF_6$, 50 sccm of $CF_4$, and 18 sccm of $O_2$. In alternative embodiments, a harsh agent such as $NF_3$ may be used in place of $SF_6$, and chemical agents such as $CHF_3$, $C_2F_6$, or $C_3F_8$ may be used in place of $CF_4$. Source power supply 105 applies 300 Watts of RF powers at a frequency of 12.56 MHz to antenna 102 to ignite a plasma having ions, electrons and radicals from the process gas. Lowering source power increases the etch uniformity but decreases the etch rate. Bias power supply 106 is grounded or applies no more than 50 Watts (0.28 Watt/cm$^2$) of RF powers at a frequency of 400 KHz or 13.56 MHz to pedestal 107 to minimize high speed ion bombardment against the substrate. As shown in FIG. 4D, BCR process 208 rounds bottom corners 216. This process also rounds top corners 214 slightly and partly removes damaged outer surfaces 218 since the BCR process generally performs an isotropic etch.

Figure 4E:
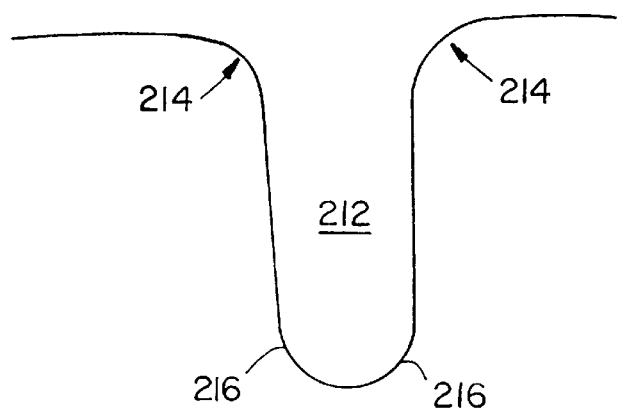
FIG. 4E is a schematic cross-sectional view of the trench of FIG. 4D soft etch has been performed.

Referring to FIGS. 3 and 4E, after the BCR process, the damaged outer surfaces of the trench are removed in soft etch process (step 210). Like the BCR process, the soft etch process is primarily a chemical process that employs high ion flux and low ion energy. The soft etch process exposes the substrate to a plasma formed from a process gas having one or more halogen sources. Preferably, the process gas also includes a source (e.g., oxygen) to enhance the dissociation of halogen sources, or a dilutant (e.g., argon), or both. Bias power is turned off or applied at minimal power (i.e., no more than 50 Watts or 0.28 Watt/cm$^2$) to eliminate or at least minimize further physical etching. The primary difference between the BCR process and soft etch process is the composition of the process gas used in each. The soft etch process is designed to be a gentler etch process than the BCR process so the former generally does not include a harsh chemical agent such as $SF_6$. For example, a preferred gas mixture for the process gas for soft etch includes $CF_4$ and $O_2$ and excludes $SF_6$ or at least includes no significant amount of $SF_6$ (i.e., no more than four percent of total gas flow). The duration of soft etch process may be set by performing the process for a predetermined time, or using an end-point detection system or other forms of in-situ monitoring system. Generally, increasing the source power, increasing the pressure, increasing the flow rate of $CF_4$, all increase the removal rate of damaged outer surfaces 218 during the soft etch process.

In one implementation, the soft etch process is performed for 30 seconds. The chamber pressure is held at low pressure, e.g., at 9 mT. Lowering the chamber pressure produces more uniform etch results but at the cost of reducing the etch rate. A process gas is flowed into the chamber at the flow rate of 100 sccm of $CF_4$ and 20 sccm of $O_2$. Alternatively, chemical agents such as $CHF_3$, $C_2 F_6$, or $C_3 F_8$ may be used in place of $CF_4$. Source power supply 105 applies 1000 Watts of RF powers at a frequency of 12.56 MHz to antenna 102 to ignite a plasma having ions, electrons and radicals from the process gas. Lowering source power increases the etch uniformity but decreases the etch rate. Bias power supply 106 is grounded or applies no more than 50 Watts (0.28 Watt/cm$^2$) of RF powers at a frequency of 400 KHz or 13.56 MHz to pedestal 107 to minimize high speed ion bombardment against the substrate. As shown in FIG. 4E, soft etch 210 removes damaged outer surfaces.

After the soft etch process, the substrate can be dipped in a cleaning solution such as a hydrofluoric acid to remove any residue polymer on the substrate. In some instances, a wet etch may be further performed on the substrate to further remove any existing damage outer surfaces 218.

Table 1 below provides acceptable ranges for the chamber pressure, bias power, source power, and the like for steps 206, 208, and 210 according to one embodiment of the present invention.

TABLE 1

| | Process Recipes | | |
|---|---|---|---|
| | TCR | BCR | SoftEtch |
| Pressure | 4 to 25 mT | 4 to 25 mT | 4 to 25 mT |
| $W_b$ | 200 to 1500 Watts, or 1.11–8.33 Watts/cm$^2$ | 0 to 50 Watts, or 0–0.28 Watt/cm$^2$ | 0 to 50 Watts, or 0–0.28 Watt/cm$^2$ |
| $W_s$ | 200 to 1500 Watts | 200 to 1500 Watts | 200 to 1500 Watts |
| Ar | 10 to 200 sccm | — | — |
| $SF_6$ | — | 0 to 50 sccm | no more than 4% of total gas flow |
| $CF_4$ | — | 20 to 200 sccm | 20 to 200 sccm |
| $O_2$ | — | 5 to 100 sccm | 5 to 100 sccm |
| Time | 10 to 100 sec | 10 to 100 sec | 10 to 100 sec |

Table 2 below provides acceptable ranges for the chamber pressure, bias power, source power, and the like for steps 206, 208, and 210 according to another embodiment of the present invention.

TABLE 2

| | Process Recipes | | |
|---|---|---|---|
| | TCR | BCR | SoftEtch |
| Pressure | 4 to 25 mT | 1 to 25 mT | 4 to 25 mT |
| $W_b$ | 200 to 1500 Watts, or 1.11–8.33 Watts/cm$^2$ | 0 to 50 Watts, or 0–0.28 Watt/cm$^2$ | 0 to 50 Watts, or 0–0.28 Watt/cm$^2$ |
| $W_s$ | 200 to 1500 Watts | 200 to 1500 Watts | 200 to 1500 Watts |
| Ar | 10 to 200 sccm | 80–95% of total gas flow, preferably 180 sccm | — |
| $SF_6$ | — | 5–20% of total gas flow, preferably 20 sccm | no more than 4% of total gas flow |
| $CF_4$ | — | — | 20 to 200 sccm |
| $O_2$ | — | — | 5 to 100 sccm |
| Time | 10 to 100 sec | 10 to 60 sec | 10 to 100 sec |

The three remedial etch processes are preferably performed in an in-situ process in the order of TCR, BCR, and soft etch. The soft etch process is preferably performed last because it is most effective of the three in removing the damaged outer surfaces without significantly altering the trench profile or worsening the sidewall roughness. Process 200 is preferably performed in an etch system having a source power supply and a bias power supply, so that all three etch techniques can be performed in the same chamber.

The gas flow rates and RF power levels described herein are based on etch processes run in a DPS chamber manufactured by Applied Materials that is outfitted for six inch wafers. A person of ordinary skill in the art will recognize that these values are in part chamber specific and may vary if chambers of other design and/or volume are employed.

While the foregoing is directed to certain preferred embodiments of the present invention, other and further embodiments of the invention may be devised without departing from the basic scope of the invention. For example, one such an alternative embodiment may employ only the TCR etch and BCR etch. Decreasing the flow rate of $SF_6$ may allow the BCR etch to round the bottom corners and remove the damaged outer surfaces of the trench without making the outer surfaces of the trench unacceptably rough. In another embodiment, the BCR step is not performed, instead the TCR step is followed by the soft etch step. In still another embodiment, the process gas used in the BCR and soft etch processes may include sputtering agents for gas dilution or other purposes as long as minimal bias power (i.e., no more than 50 Watts or 0.28 Watts/cm$^2$) is applied to the pedestal. Yet in another embodiment, the present invention may be practiced in an etch system which ignites a plasma remote from the process chamber and which can control bias power being applied to the process chamber. In this embodiment, ions, radials and other constituents from the plasma are flowed into the substrate processing chamber. These alternatives along with other alternatives and equivalents are intended to be included within the scope of the present invention.

What is claimed is:

1. A method for processing a substrate disposed in a substrate processing chamber to modify the contour of a trench formed on the substrate, the substrate processing chamber being of the type that has a coil and a plasma generation system including a source power system operatively coupled to the coil and a bias power system operatively coupled to the substrate process chamber, the method comprising:

transferring the substrate into the substrate process chamber;

thereafter, exposing the substrate in-situ to a plasma formed from a first process gas consisting essentially of a sputtering agent by applying RF energy from the source power system to the coil and biasing the plasma toward the substrate by applying bias power to the substrate process chamber; and thereafter, exposing the substrate in-situ to a plasma formed from a second process gas without applying bias power or applying minimal bias power to the substrate process chamber.

2. The method of claim 1 wherein the sputtering agent is a gas selected from the group consisting of argon, krypton, xenon and radon.

3. The method of claim 1 wherein the minimal bias power is 0.28 Watts/cm$^2$ or less.

4. The method of claim 1 wherein the second process gas comprises $SF_6$, $CF_4$, and $O_2$.

5. The method of claim 1 wherein the second process gas comprises $SF_6$ and Ar.

6. The method of claim 1 wherein the second process gas comprises an oxygen source, a halogen source selected from the group consisting of $SF_6$ and $NF_3$, and a halogen source selected from the group of $CHF_3$, $C_2F_6$, $C_3F_8$, and $CF_4$.

7. A method for processing a substrate disposed in a substrate processing chamber to modify the contour of a trench formed on the substrate, the substrate processing chamber being of the type that has a coil and a plasma generation system including a source power system operatively coupled to the coil and a bias power system operatively coupled to the substrate process chamber, the method comprising:

transferring the substrate into the substrate process chamber;

thereafter, exposing the substrate in-situ to a plasma formed from a first process gas consisting essentially of a sputtering agent by applying RF energy from the source power system to the coil and biasing the plasma toward the substrate by applying bias power to the substrate process chamber;

thereafter, exposing the substrate in-situ to a plasma formed from a second process gas without applying bias power or applying minimal bias power to the substrate process chamber; and after exposing the substrate to the plasma formed from the second process gas, exposing the substrate to a plasma formed from a third process gas having a different gas mixture than that of the first process gas without applying bias power or applying minimal biasing power to the substrate process chamber.

8. The method of claim 7 wherein the third process gas comprises $CF_4$ and $O_2$ but not $SF_6$.

9. The method of claim 7 wherein the third process gas comprises an oxygen source and a halogen source selected from the group consisting of $CHF_3$, $C_2F_6$, $C_3F_8$, and $CF_4$.

10. A method for processing a substrate disposed in a substrate processing chamber to modify the contour of a trench formed on the substrate, the substrate processing chamber including a bias power system operatively coupled to the substrate process chamber, the method comprising:

transferring the substrate into the substrate process chamber;

igniting a first plasma formed from a first process gas comprising a sputtering agent;

exposing the substrate to ions derived from the first plasma and biasing the ions toward the substrate by applying bias power to the substrate process chamber;

thereafter, igniting a second plasma formed from a second process gas comprising a halogen source; and without removing the substrate from the substrate process chamber, exposing the substrate to ions derived from the second plasma without applying bias power or applying minimal biasing power to the substrate process chamber.

11. The method of claim 10 wherein the minimal bias power is 0.28 Watt/cm$^2$ or less.

12. The method of claim 10 wherein the first and second plasmas are ignited remote from the substrate process chamber.

13. A method for processing a substrate disposed in a substrate processing chamber to modify the contour of a trench formed on the substrate, the substrate processing chamber including a bias power system operatively coupled to the substrate process chamber, the method comprising:

transferring the substrate into the substrate process chamber;

igniting a first plasma formed from a first process gas comprising a sputtering agent;

exposing the substrate to ions derived from the first plasma and biasing the ions toward the substrate by applying bias power to the substrate process chamber;

thereafter, igniting a second plasma formed from a second process gas comprising a halogen source; without removing the substrate from the substrate process chamber, exposing the substrate to ions derived from the second plasma without applying bias power or applying minimal biasing power to the substrate process chamber;

after exposing the substrate to the ions and radicals dissociated in the second plasma, igniting a third plasma formed from a third process gas having a different gas mixture than that of the second process gas; and exposing the substrate to ions and radicals dissociated in the third plasma without applying bias power or applying minimal biasing power to the substrate process chamber while leaving the substrate in the substrate process chamber.

14. A method for forming a trench on a substrate, the method comprising:

patterning a photoresist layer to define a location for the trench;

etching the substrate to form the trench;

stripping the photoresist layer from the substrate; and transferring the substrate having the trench formed thereon into a substrate processing chamber having a plasma generation system with separate controls for source power and bias power, and processing the substrate by:

flowing a first gas consisting essentially of a sputtering agent into the chamber to form a first plasma from the first gas and etching the substrate to round primarily an upper corner of the trench with the first plasma by applying both source power and bias power, and thereafter, without removing the substrate from the substrate process chamber, flowing a second gas including a halogen source into the chamber to form a second plasma from the second gas and etching the substrate to round a lower corner of the trench with the second plasma by lowering or grounding the bias power being applied to the chamber.

15. The method of claim 14 further comprising:

removing the substrate from the substrate process chamber after etching the substrate with the first plasma and the second plasma; and dipping the removed substrate in a hydrofluoric acid to clean the substrate.

16. The method of claim 14 further comprising:

forming an oxide over the trench after etching the substrate with the first and second plasma; and filling the trench with a polysilicon to form a vertical transistor.

17. The method of claim 14 wherein the trench is etched in a silicon substrate.

18. The method of claim 14 wherein the trench is etched in an epitaxial silicon layer.

19. A method for forming a trench on a substrate, the method comprising:

patterning a photoresist layer to define a location for the trench;

etching the substrate to form the trench;

stripping the photoresist layer from the substrate; and transferring the substrate having the trench formed thereon into a substrate processing chamber having a plasma generation system with separate controls for source power and bias power, and processing the substrate by:

flowing a first gas consisting essentially of a sputtering agent into the chamber to form a first plasma from the first gas and etching the substrate to round primarily an upper corner of the trench with the first plasma by applying both source power and bias power, thereafter, without removing the substrate from the substrate process chamber, flowing a second gas including a halogen source into the chamber to form a second plasma from the second gas and etching the substrate to round a lower corner of the trench with the second plasma by lowering or grounding the bias power being applied to the chamber, and after etching the substrate with the second plasma, flowing a third gas having a different gas mixture than the second gas into the chamber and forming a third plasma from the third gas and etching the substrate without removing the substrate from the substrate process chamber.

20. A method for etching a substrate disposed within a substrate processing chamber, the method comprising:

etching the substrate using a first plasma formed from a first process gas consisting essentially of argon;

etching the substrate using a second plasma formed from a second process gas consisting essentially of $SF_6$, $CF_4$, and $O_2$; and etching the substrate using a third plasma formed from a third process gas consisting essentially of $CF_4$ and $O_2$.

21. A method for processing a substrate disposed in a substrate processing chamber having a plasma generation system with separate controls for source power and bias power, said method comprising:

transfering the substrate into said substrate processing chamber, said substrate having at least one trench formed thereon, said trench having upper and lower angular corners and an outer surface having a first roughness;

rounding said upper angular corners of said trench by forming a first plasma within said chamber from a first gas consisting essentially of a sputtering agent and exposing said trench to said first plasma, wherein said first plasma is formed by applying both source and bias power;

thereafter, rounding said lower angular corners of said trench by forming a second plasma within said chamber from a second gas comprising at least one fluorine-containing source and exposing said trench to said second plasma, wherein said second plasma is formed by applying source power either without applying bias power or while applying with minimal bias power; and thereafter, decreasing the roughness of said outer surface of said trench to a second roughness by forming a third plasma within said chamber from a third process gas comprising at least one fluorine-containing source and exposing said trench to said third plasma, wherein wherein said third plasma is formed by applying source power either without applying bias power or while applying minimal bias power and said third process gas is different from said second process gas.

* * * * *